(12) United States Patent
Kim et al.

(10) Patent No.: US 10,833,129 B2
(45) Date of Patent: Nov. 10, 2020

(54) IMAGE SENSOR WITH STACKED STRUCTURES

(71) Applicant: Samsung Electronics Co., Ltd., Suwon-si (KR)

(72) Inventors: Kwan-sik Kim, Seoul (KR); Chang-hwa Kim, Hwaseong-si (KR); Yoon-Kyoung Kim, Hwaseong-si (KR); Sang-Su Park, Seoul (KR); Beom-suk Lee, Yongin-si (KR); Man-geun Cho, Suwon-si (KR); Min-jun Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/436,239

(22) Filed: Jun. 10, 2019

(65) Prior Publication Data

US 2020/0105836 A1    Apr. 2, 2020

(30) Foreign Application Priority Data

Oct. 2, 2018    (KR) .......................... 10-2018-0117873

(51) Int. Cl.
*H01L 27/30*    (2006.01)
*H01L 27/28*    (2006.01)

(52) U.S. Cl.
CPC .......... *H01L 27/307* (2013.01); *H01L 27/286* (2013.01)

(58) Field of Classification Search
CPC ................. H01L 27/307; H01L 27/286; H01L 27/14643; G01J 2001/446
See application file for complete search history.

(56) References Cited

U.S. PATENT DOCUMENTS

| | | | |
|---|---|---|---|
| 9,349,766 B2 | 5/2016 | Sugiura | |
| 9,576,998 B2 | 2/2017 | Akiyama | |
| 9,577,012 B2 | 2/2017 | Ooki et al. | |
| 9,698,188 B2 | 7/2017 | Togashi | |
| 9,893,123 B2 | 2/2018 | Lee et al. | |
| 2012/0153128 A1* | 6/2012 | Roy .................. | H01L 27/14689 250/208.1 |
| 2013/0323875 A1* | 12/2013 | Park .................... | H01L 27/1463 438/70 |
| 2014/0239362 A1* | 8/2014 | Koo .................... | H01L 27/1464 257/294 |

(Continued)

FOREIGN PATENT DOCUMENTS

KR    10-0518215    10/2005

*Primary Examiner* — Didarul A Mazumder
(74) *Attorney, Agent, or Firm* — Harness, Dickey & Pierce, P.L.C.

(57) ABSTRACT

Provided is an image sensor, which includes: a first substrate; a first structure on a front surface of the first substrate, the first structure including a first interlayer insulating layer surrounding a first conductive layer; a second substrate; a second structure on a front surface of the second substrate facing the front surface of the first substrate, the second structure including a second interlayer insulating layer, the second interlayer insulating layer being bonded to the first interlayer insulating layer; an organic photoelectric layer on a back surface of the second substrate; and a via electrode structure in contact with the first conductive layer through the second substrate and the second structure, the via electrode structure including an air gap therein.

20 Claims, 15 Drawing Sheets

(56) References Cited

U.S. PATENT DOCUMENTS

| | | | |
|---|---|---|---|
| 2015/0372031 A1* | 12/2015 | Yoon | H01L 27/14689 |
| | | | 257/446 |
| 2016/0247850 A1* | 8/2016 | Akiyama | H01L 27/14623 |
| 2017/0098671 A1* | 4/2017 | Shinohara | H01L 27/1464 |
| 2018/0012924 A1 | 1/2018 | Umebayashi et al. | |
| 2018/0053796 A1* | 2/2018 | Baek | H01L 27/1464 |
| 2018/0090533 A1 | 3/2018 | Otake et al. | |
| 2018/0286922 A1* | 10/2018 | Togashi | H01L 27/14647 |

* cited by examiner

IMAGE SENSOR WITH STACKED STRUCTURES

CROSS-REFERENCE TO RELATED APPLICATION

This application claims the benefit of Korean Patent Application No. 10-2018-0117873, filed on Oct. 2, 2018, in the Korean Intellectual Property Office, the disclosure of which is incorporated herein in its entirety by reference.

BACKGROUND

Inventive concepts relate to an image sensor, and more particularly, to an image sensor including a back via stack.

Image sensors, which capture images and convert the images into electrical signals, are used in not only consumer electronic devices such as digital cameras, cameras mounted on mobile phones, and portable camcorders, but also cameras mounted in automobiles, security devices, and robots. Since the image sensors are increasingly being reduced in size while requiring high resolution, image sensors including organic photoelectric layers are being studied to reduce pixel sizes.

In a conventional image sensor including organic photoelectric layers, a material having a relatively good step coverage, such as a negative photoresist, may be used to fill an inner area of a via electrode hole of a via electrode structure. However, because the negative photoresist is susceptible to high temperatures, the material filling the inner area of the via electrode hole may become contaminated when performing a subsequent high temperature process, which may reduce productivity and reliability of the conventional image sensor.

SUMMARY

Inventive concepts involve an image sensor including an organic photoelectric layer which has improved productivity and reliability by including a back via stack including an air gap therein to substantially prevent (limit or reduce) contamination that may otherwise be caused by the inner area of the back via stack being filled with a material that is susceptible to high temperatures.

To address the above-described problems with the conventional image sensor, an image sensor according to example embodiments of the inventive concepts uses an electrode filling layer including a material having a relatively poor step coverage to fill an inner area of a via electrode hole of a via electrode structure together with the air gap. Since the via electrode hole is filled with the air gap and the electrode filling layer that encapsulates the air gap, there is no material susceptible to high temperatures, such that a subsequent high temperature process may be performed without contamination. Accordingly, productivity and reliability of the image sensor including the organic photoelectric layer may be improved as compared to the above-described conventional image sensor.

According to some example embodiments of the inventive concepts, there is provided an image sensor including: a first substrate; a first structure on a front surface of the first substrate, the first structure including a first interlayer insulating layer surrounding a first conductive layer; a second substrate; a second structure on a front surface of the second substrate facing the front surface of the first substrate, the second structure including a second interlayer insulating layer, the second interlayer insulating layer being bonded to the first interlayer insulating layer; an organic photoelectric layer on a back surface of the second substrate; and a via electrode structure in contact with the first conductive layer through the second substrate and the second structure, the via electrode structure including an air gap therein.

According to some example embodiments of the inventive concepts, there is provided an image sensor including: a first substrate including an element area and a first via electrode area; a second substrate including a pixel area and a second via electrode area; a color filter layer on the pixel area of the second substrate; an organic photoelectric layer on the color filter layer; and a via electrode structure penetrating the second via electrode area of the second substrate, the via electrode structure being in contact with the first via electrode area of the first substrate, wherein the via electrode structure includes: an electrode conductive layer including a conductive material; and an electrode filling layer surrounding the electrode conductive layer, the electrode filling layer including an air gap at a central portion thereof and an insulating material.

According to some example embodiments of the inventive concepts, there is provided an image sensor including: a first substrate including a first via electrode area and an element area including a logic device; a first interlayer insulating layer on a front surface of the first substrate, the first interlayer insulating layer including a first conductive layer in the first via electrode area; a second substrate including a second via electrode area and a pixel area including a photoelectric conversion element; a second interlayer insulating layer on a front surface of the second substrate facing the front surface of the first substrate, the second interlayer insulating layer being bonded to the first interlayer insulating layer; a bottom transparent electrode layer on a back surface of the second substrate, the bottom transparent electrode layer corresponding to the photoelectric conversion element; a top transparent electrode layer on the back surface of the second substrate; an organic photoelectric layer between the top transparent electrode layer and the bottom transparent electrode layer; and a via electrode structure penetrating the second substrate and the second interlayer insulating layer in the second via electrode area to contact the first conductive layer in the first via electrode area, the via electrode structure including an air gap therein.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

Hereinafter, some example embodiments of the inventive concepts will be described in detail with reference to the accompanying drawings.

Figure 1A:
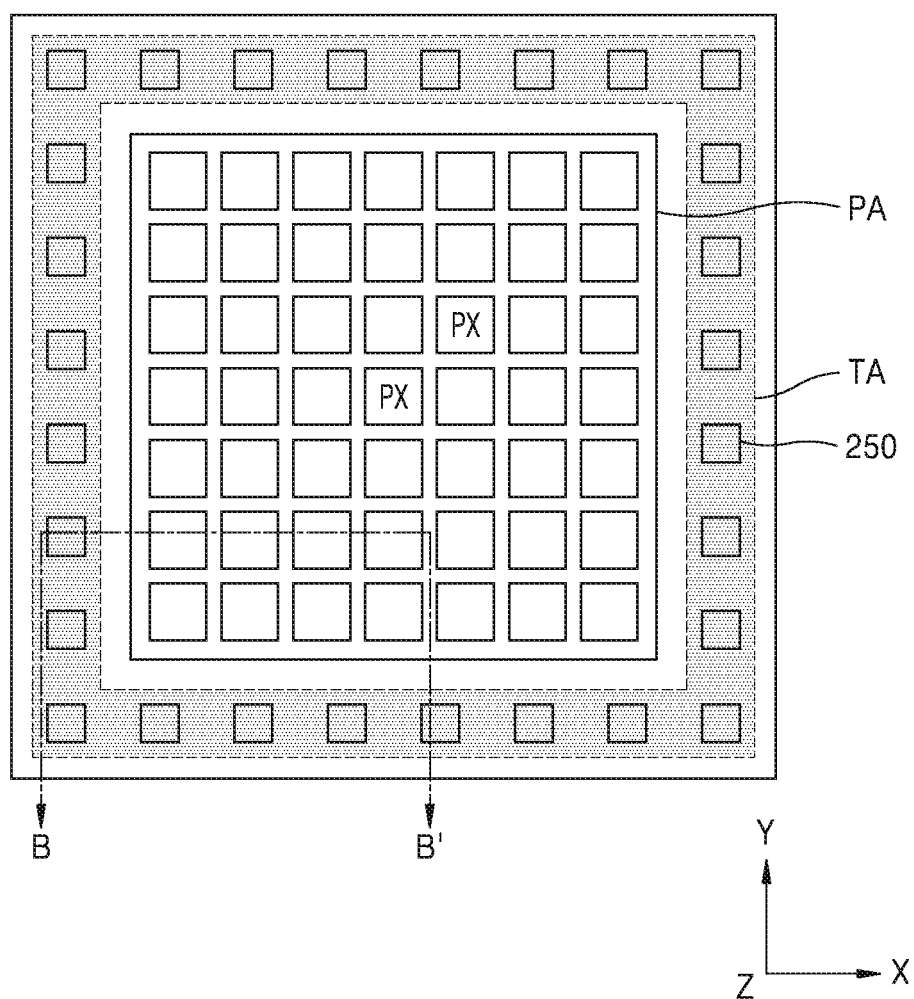
FIG. 1A is a plan view of an image sensor according to some example embodiments.
Figure 1B:
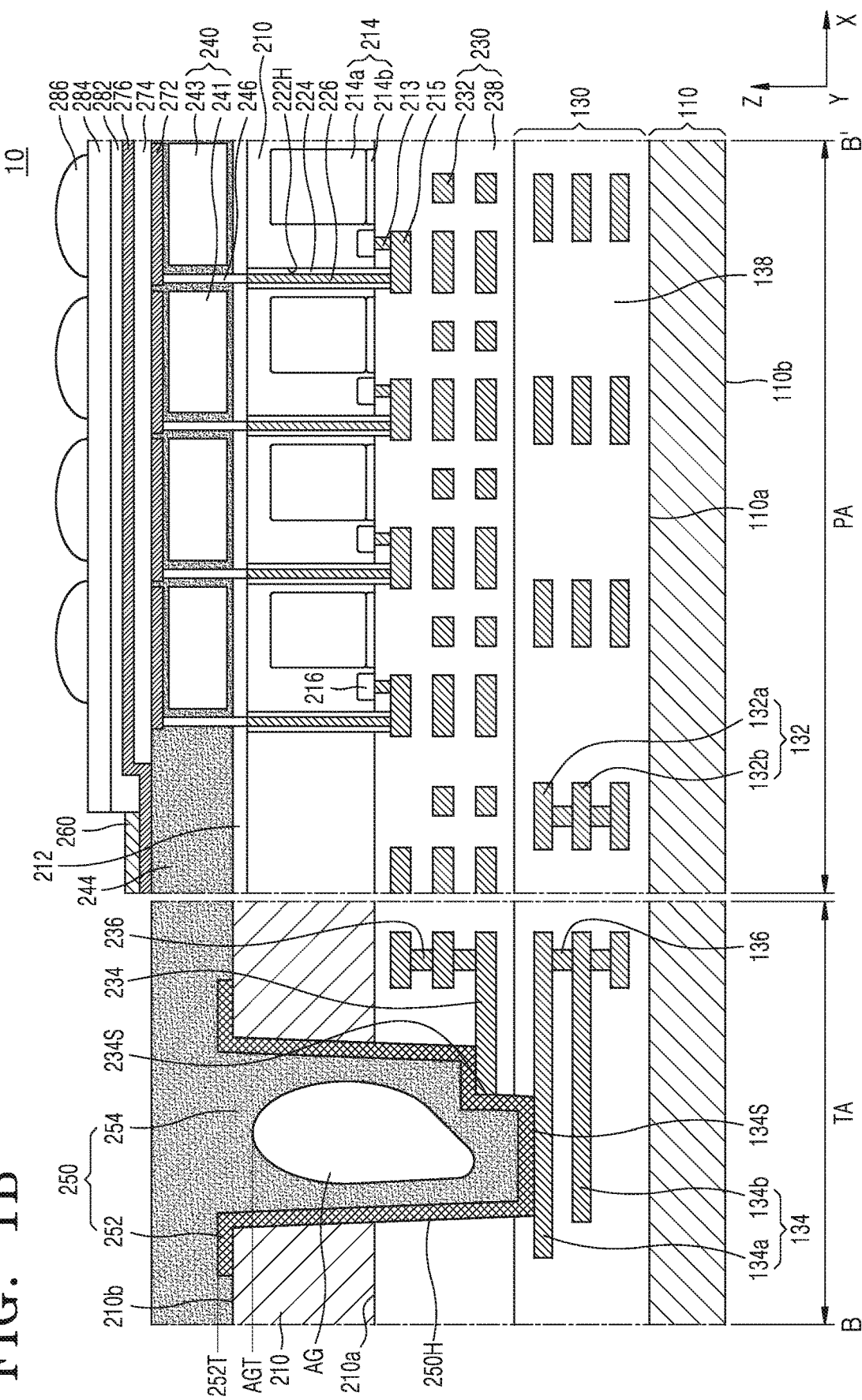
FIG. 1B is a cross-sectional view of an image sensor taken along a line B-B' in FIG. 1A.

FIG. 1A is a plan view of an image sensor 10 according to some example embodiments, and FIG. 1B is a cross-sectional view of the image sensor 10 taken along a line B-B' in FIG. 1A.

Referring to FIGS. 1A and 1B, the image sensor 10 may include a pixel area PA, in which a plurality of unit pixels PX are arranged, and a via electrode area TA surrounding the pixel area PA and in which a plurality of via electrode structures 250 are arranged.

Although the via electrode area TA is illustrated as surrounding the pixel area PA in FIG. 1A, a layout of the image sensor 10 in the plan view is not limited thereto.

The image sensor 10 may include a first substrate 110 and a second substrate 210, a first structure 130 formed on a first surface 110a of the first substrate 110, and a second structure 230 formed on a first surface 210a of the second substrate 210. The first structure 130 and the second structure 230 may be bonded to each other such that the first surface 110a of the first substrate 110 and the first surface 210a of the second substrate 210 face each other.

Each of the first and second substrates 110 and 210 may include the first surfaces 110a and 210a and the second surfaces 110b and 210b, respectively. The first surfaces 110a and 210a may correspond to front surfaces of the first and second substrates 110 and 210, respectively, and the second surfaces 110b and 210b may correspond to back surfaces of the first and second substrates 110 and 210, respectively.

Each of the first and second substrates 110 and 210 may include a semiconductor substrate, which is referred to as a wafer. The first and second substrates 110 and 210 may include a semiconductor material, for example, silicon (Si). In some other example embodiments, the first and second substrates 110 and 210 may include a semiconductor material such as germanium (Ge), or a compound semiconductor material such as SiC, GaAs, InAs, and/or InP.

The first structure 130 may be formed on the first surface 110a of the first substrate 110. The first structure 130 may include first wiring layers 132 (e.g., first wiring layers 132a, 132b, etc.) formed on different levels in the pixel area PA, first conductive layers 134 (e.g., first conductive layers 134a, 134b, etc.) formed on different levels in the via electrode area TA, contact plugs 136 connecting the first wiring layers 132 to each other and connecting the first conductive layers 134 to each other, and a first interlayer insulating layer 138 embedding the first wiring layers 132, the first conductive layers 134, and the contact plugs 136.

In some example embodiments, the pixel area PA of the first substrate 110 may correspond to an element area. In other words, a logic device (not shown) for controlling the image sensor 10 may be arranged in the element area of the first substrate 110.

The second structure 230 may be formed on the first surface 210a of the second substrate 210. The second structure 230 may include second wiring layers 232 formed on different levels in the pixel area PA, second conductive layers 234 formed on different levels in the via electrode area TA, contact plugs 236 connecting the second conductive layers 234 to each other, and a second interlayer insulating layer 238 embedding the second wiring layers 232, the second conductive layers 234, and the contact plugs 236.

The first and second wiring layers 132 and 232, the first and second conductive layers 134 and 234, and the contact plugs 136 and 236 may include Cu, W, WN, Ta, Ti, TaN, TiN, Co, Mn, Al, AN, or a combination thereof, but some other example embodiments are not limited thereto.

A plurality of photoelectric conversion elements 214 may be arranged in the pixel area PA of the second substrate 210. The photoelectric conversion element 214 may be arranged in each of the unit pixels PX in the pixel area PA. In some example embodiments, the photoelectric conversion element 214 may include a photodiode.

The photoelectric conversion element 214 may include a first impurity area 214a and a second impurity area 214b. For example, the first impurity area 214a may be formed deep from the first surface 210a of the second substrate 210 to the second surface 210b, and the second impurity area 214b may be thinly formed on the first surface 210a of the second substrate 210. The first impurity area 214a and the second impurity area 214b may have different conductivity types. For example, the first impurity area 214a may be doped with an n-type impurity, and the second impurity area 214b may be doped with a p-type impurity.

A storage node area 216 may be arranged adjacent to (e.g., near, next to, neighboring) the photoelectric conversion element 214. The storage node area 216 may be doped with, for example, an n-type impurity. The storage node area 216 may include a doped area. In addition, the storage node area 216 may have a smaller horizontal area than the photoelectric conversion element 214.

In the second structure 230, a contact via 213 contacting the storage node area 216 and extending into the second structure 230, and a buffer layer 215 in contact with the contact via 213, may be formed. The buffer layer 215 may be electrically connected to the storage node area 216 by the contact via 213.

In the pixel area PA of the second substrate 210, a first via hole 222H may be formed which extends through the second substrate 210 from the second surface 210b to the buffer layer 215. A via insulating layer 224 may be formed on a side wall of the first via hole 222H. The via insulating layer 224 may include silicon oxide and/or silicon nitride, for example. The first via hole 222H may be filled with a first via plug 226. The first via plug 226 may substantially fill the first via hole 222H so as to contact the via insulating layer 224. Accordingly, the first via plug 226 may penetrate the second substrate 210 and contact the buffer layer 215.

An anti-reflective layer 212 may be formed to flatly cover a partially recessed portion of the second surface 210b of the second substrate 210. The anti-reflective layer 212 may prevent (limit or reduce) reflection of light incident on the second substrate 210 from the outside and accordingly, allow more light to be incident on the photoelectric conversion element 214. The anti-reflective layer 212 may include, for example, SiON, SiC, SiCN, SiCO, etc.

On the second surface 210b of the second substrate 210, a color filter layer 240 may be formed on the anti-reflective layer 212. The color filter layer 240 may transmit light incident through a microlens 286 and allow only light of a required (or desired) wavelength to be incident on the photoelectric conversion element 214.

In some example embodiments, the color filter layer 240 may include a first color filter layer 241 and a second color filter layer 243. In each of the unit pixels PX in the pixel area PA, a first color filter layer 241 or a second color filter layer 243 corresponding to the photoelectric conversion element 214 may be arranged.

In some example embodiments, the first color filter layer 241 may include a red color filter, and the second color filter layer 243 may include a blue color filter. Accordingly, the first color filter layer 241 may transmit light of a red color wavelength so that the light of the red color wavelength reaches the photoelectric conversion element 214 to which the first color filter layer 241 corresponds. In addition, the second color filter layer 243 may transmit light of a blue color wavelength so that the light of the blue color wavelength reaches the photoelectric conversion element 214 to which the second color filter layer 243 corresponds.

On the second surface 210b of the second substrate 210, a first cover insulating layer 244 covering the color filter layer 240 may be formed. A top surface of the first cover insulating layer 244 may be formed to have a substantially identical level as, or a lower level than, a bottom surface of an organic photoelectric layer 274. The first cover insulating layer 244 may include, for example, silicon oxide, silicon oxynitride, a low dielectric material, a resin layer, or a combination thereof, but some other example embodiments are not limited thereto. As will be described later, the first cover insulating layer 244 may include a substantially identical material at a substantially identical level as an electrode filling layer 254. As used herein, the phrases "substantially the same level" and/or "substantially identical level" refer to respective elements having the same or identical level, within manufacturing tolerances. That is, respective elements being "at" the same/identical level or substantially the same/identical level means that the respective elements are coplanar or substantially coplanar with respect to each other. Similarly, the phrases "substantially the same material" and/or "substantially identical material" refer to respective elements being formed of the same/identical material or substantially the same/identical material, within material tolerances.

In some example embodiments, the first cover insulating layer 244 may have a multi-layer structure. A first portion of the first cover insulating layer 244 may be arranged between the color filter layer 240 and the anti-reflective layer 212, and a second portion of the first cover insulating layer 244 may be arranged on a top surface of the color filter layer 240, for example.

Inside the first cover insulating layer 244, a second via plug 246 penetrating the first cover insulating layer 244 and electrically connected to the first via plug 226 may be formed. The second via plug 246 may be formed in an integral structure extending from the top surface to a bottom surface of the first cover insulating layer 244, but some other example embodiments are not limited thereto. For example, the second via plug 246 may be formed in a multi-layer structure extending from the top surface to the bottom surface of the first cover insulating layer 244.

At least a portion of the second via plug 246 may include a transparent conductive material. In some example embodiments, the second via plug 246 may include a first portion of a metallic material and a second portion of a transparent conductive material, and the second portion of the transparent conductive material of the second via plug 246 may be integrally formed together with a bottom transparent electrode layer 272.

The bottom transparent electrode layer 272 may be formed on the first cover insulating layer 244. The bottom transparent electrode layer 272 may include a plurality of portions spaced apart to correspond to the plurality of photoelectric conversion elements 214, respectively. The bottom transparent electrode layer 272 may include a transparent conductive material, for example, ITO, IZO, ZnO, antimony-doped tin oxide (ATO), and/or aluminum-doped zinc oxide (AZO).

In some example embodiments, a bottom surface of the bottom transparent electrode layer 272 and the top surface of the first cover insulating layer 244 may be flat at substantially the same level. After a plurality of holes penetrating the first cover insulating layer 244 are formed and the transparent electrode material that covers the first cover insulating layer 244 and fills the plurality of holes is formed, a damascene process may be performed to remove a portion of the transparent electrode material such that the top surface of the first cover insulating layer 244 may be exposed. By using such processes, at least a portion of the second via plug 246 integrally formed with the bottom transparent electrode layer 272, and the bottom transparent electrode layer 272, may be formed. In this case, as described above, at least a portion of the second via plug 246 may include a transparent conductive material.

In the pixel area PA of the second substrate 210, the organic photoelectric layer 274 may be formed on the bottom transparent electrode layer 272. The organic photoelectric layer 274 may be integrally formed on the plurality of portions of the bottom transparent electrode layer 272, for example. The organic photoelectric layer 274 may be formed across a plane formed by the top surface of the bottom transparent electrode layer 272 and the top surface of the first cover insulating layer 244, for example. In some example embodiments, the organic photoelectric layer 274 may include an organic material that causes photoelectric conversion only to light of a particular (or desired) wavelength. For example, the organic photoelectric layer 274 may cause photoelectric conversion only at a wavelength of the green color light. In other words, the organic photoelectric layer 274 may exhibit a maximum absorption wavelength ($\lambda$max) at about 500 nm to about 600 nm, for example.

The organic photoelectric layer 274 may be a layer in which the p-type semiconductor material and the n-type semiconductor material form a pn junction or a bulk heterojunction, in a single layer or a plurality of layers, and after receiving the incident light to generate excitons, may perform an operation of separating the excitons into holes and electrons.

In example embodiments where the organic photoelectric layer 274 includes a plurality of layers, the organic photoelectric layer 274 may include various combinations of, for example, a p-type layer/an intrinsic layer, an intrinsic layer/an n-type layer, a p-type layer/an intrinsic layer/an n-type layer, a p-type layer/an n-type layer, etc. In addition, the organic photoelectric layer 274 may have an appropriate (or desired) thickness, for effectively absorbing light and effectively separating and transferring holes and electrons, to improve photoelectric conversion efficiency.

A top transparent electrode layer 276 may be formed on the organic photoelectric layer 274. The top transparent electrode layer 276 may be integrally formed across the pixel area PA, for example. In other words, the top transparent electrode layer 276 may be formed integrally over the plurality of photoelectric conversion elements 214, for example. In some example embodiments, the top transparent electrode layer 276 may be formed to cover both a top surface and a side surface of the organic photoelectric layer 274.

A second cover insulating layer 282 may be formed on the first cover insulating layer 244 and the top transparent electrode layer 276. The second cover insulating layer 282 may include a transparent insulating material. The second cover insulating layer 282 may include, for example, silicon oxide.

The second cover insulating layer 282 may be formed not to cover a top surface of an electrode pad 260. In addition, the second cover insulating layer 282 may be formed not to cover a portion of the top transparent electrode layer 276. The electrode pad 260 may be formed on the portion of the top transparent electrode layer 276 that is not covered by the second cover insulating layer 282, for example.

In some example embodiments, a third cover insulating layer 284 may be formed on the second cover insulating layer 282. The third cover insulating layer 284 may be formed to cover a top surface of the second cover insulating layer 282. The third cover insulating layer 284 may include a transparent insulating material. The third cover insulating layer 284 may include, for example, silicon oxide. However, in some other example embodiments, the third cover insulating layer 284 may be omitted.

In the pixel area PA of the second substrate 210, a microlens 286 corresponding to the color filter layer 240 may be formed on the third cover insulating layer 284, for example. In some other example embodiments, in which the third cover insulating layer 284 is omitted, the microlenses 286 may be formed on the second cover insulating layer 282. The microlenses 286 may be formed to overlap the color filter layers 240 respectively corresponding to the microlenses 286. In other words, a plurality of microlenses 286 may be formed and the plurality of microlenses 286 may respectively correspond to the plurality of color filter layers 240. The microlens 286 may change a path of the light incident on an area other than the photoelectric conversion element 214 to concentrate more light onto the photoelectric conversion element 214.

The via electrode area TA may be referred to as a first via electrode area in the first substrate 110 and as a second via electrode area in the second substrate 210. The first and second via electrode areas may be arranged at positions corresponding to each other to form one via electrode area TA.

In the via electrode area TA, a via electrode structure 250 penetrating the second substrate 210 and the second structure 230 and contacting a top portion of the first structure 130 may be formed. The via electrode structure 250 may include an electrode conductive layer 252 conformally formed along a via electrode hole 250H, and an electrode filling layer 254 filling the via electrode hole 250H and remaining after the electrode conductive layer 252 is formed. A level of a top surface of the electrode filling layer 254 may be formed higher than a level of a top surface 252T of the electrode conductive layer 252.

The electrode conductive layer 252 may include, for example, tungsten (W) or a tungsten alloy. The electrode filling layer 254 may include an insulating material such as silicon oxide and/or silicon nitride, for example. In some example embodiments, the electrode filling layer 254 may include a material having a relatively poor step coverage, such as tetraethyl orthosilicate (TEOS) and/or plasma enhanced-TEOS (PE-TEOS). Accordingly, the electrode filling layer 254 may include an air gap AG therein.

In some example embodiments, the via electrode structure 250 may be in contact with a surface 234S of the second conductive layer 234. In addition, the via electrode structure 250 may be in contact with a surface 134S of the first conductive layer 134a. In other words, the first and second substrates 110 and 210 may be electrically connected to each other by the via electrode structure 250. Together, such a structure and the via electrode structure 250 may be referred to as a back via stack.

In some example embodiments, each of the first and second conductive layers 134 and 234 in contact with the via electrode structure 250 in the via electrode area TA may be arranged at the same level as the first and second wiring layers 132 and 232 arranged in the pixel area PA.

The electrode filling layer 254 in the via electrode area TA and the first cover insulating layer 244 in the pixel area PA may include a substantially identical material at a substantially identical level. The reason why may be because it is possible to form the electrode filling layer 254 and the first cover insulating layer 244 at the same time by a substantially identical process. As described above, a level of the top surface of the first cover insulating layer 244 may be equal to or lower than a level of the bottom surface of the organic photoelectric layer 274, and accordingly, the level of the top surface of the electrode filling layer 254 may be equal to or lower than the level of the bottom surface of the organic photoelectric layer 274.

As illustrated in FIG. 1B, the air gap AG may be formed in the second substrate 210, but may not be formed in the first substrate 110. However, a position of the air gap AG is not limited thereto. In addition, the air gap AG may not be limited to a shape illustrated in FIG. 1B and may have various shapes such as a circle, an ellipse, and/or a polygon, for example.

According to a conventional image sensor, which is different from the image sensor 10 of FIG. 1B, after an internal area of the via electrode hole 250H that remains after the electrode conductive layer 252 is formed in the via electrode area TA is filled with a material having a relatively good step coverage, such as a negative photoresist, subsequent processes may be performed. Such a structure may be a suitable structure in the case where a high temperature process is not included in the subsequent processes.

However, in general, in the case of an image sensor including an organic photoelectric layer, as described above, a process of forming the second via plug 246 including a portion formed by a metallic material may be performed after a process of filling the inner area of the via electrode hole 250H with the negative photoresist. Accordingly, when the negative photoresist, which is susceptible to high temperatures, is used to fill the inner area of the via electrode hole 250H in the image sensor including the organic photoelectric layer, the negative photoresist may act as a contamination source due to subsequent high temperature processes. Accordingly, the contamination source may cause a failure of the conventional image sensor (e.g., productivity and reliability of the conventional image sensor may be reduced due to the contamination caused by the high temperature processes).

On the other hand, in the case of the image sensor 10 according to example embodiments of the inventive concepts, by not using a negative photoresist susceptible to high temperatures, and instead using the electrode filling layer 254 including a material having a relatively poor step coverage, the inner area of the via electrode hole 250H may be filled together with the air gap AG. In this case, since the via electrode hole 250H is filled with the air gap AG and the electrode filling layer 254 that encapsulates the air gap AG, and thus there is no material susceptible to high temperatures even in the subsequent high temperature processes, the high temperature processes may be performed without contamination.

As a result, the image sensor 10 according to example embodiments of the inventive concepts may include the via electrode structure 250 including the air gap AG therein, and thus, the contamination that may otherwise be caused due to the material filling the inner area of the via electrode structure 250 may be prevented (limited or reduced). Accordingly, the productivity and reliability of the image sensor 10 including the organic photoelectric layer 274 may be improved as compared to the above-described conventional image sensor.

FIGS. 2 through 6 are cross-sectional views of image sensors 20, 30, 40, 50, and 60 taken along the line B-B' in FIG. 1A according to some example embodiments, respectively.

Components constituting each of the image sensors 20, 30, 40, 50, and 60 and materials constituting the components to be described below are substantially the same as or similar to those described in FIGS. 1A and 1B. Thus, for convenience of explanation, differences from the image sensor 10 of FIG. 1B are mainly described.

Figure 2:
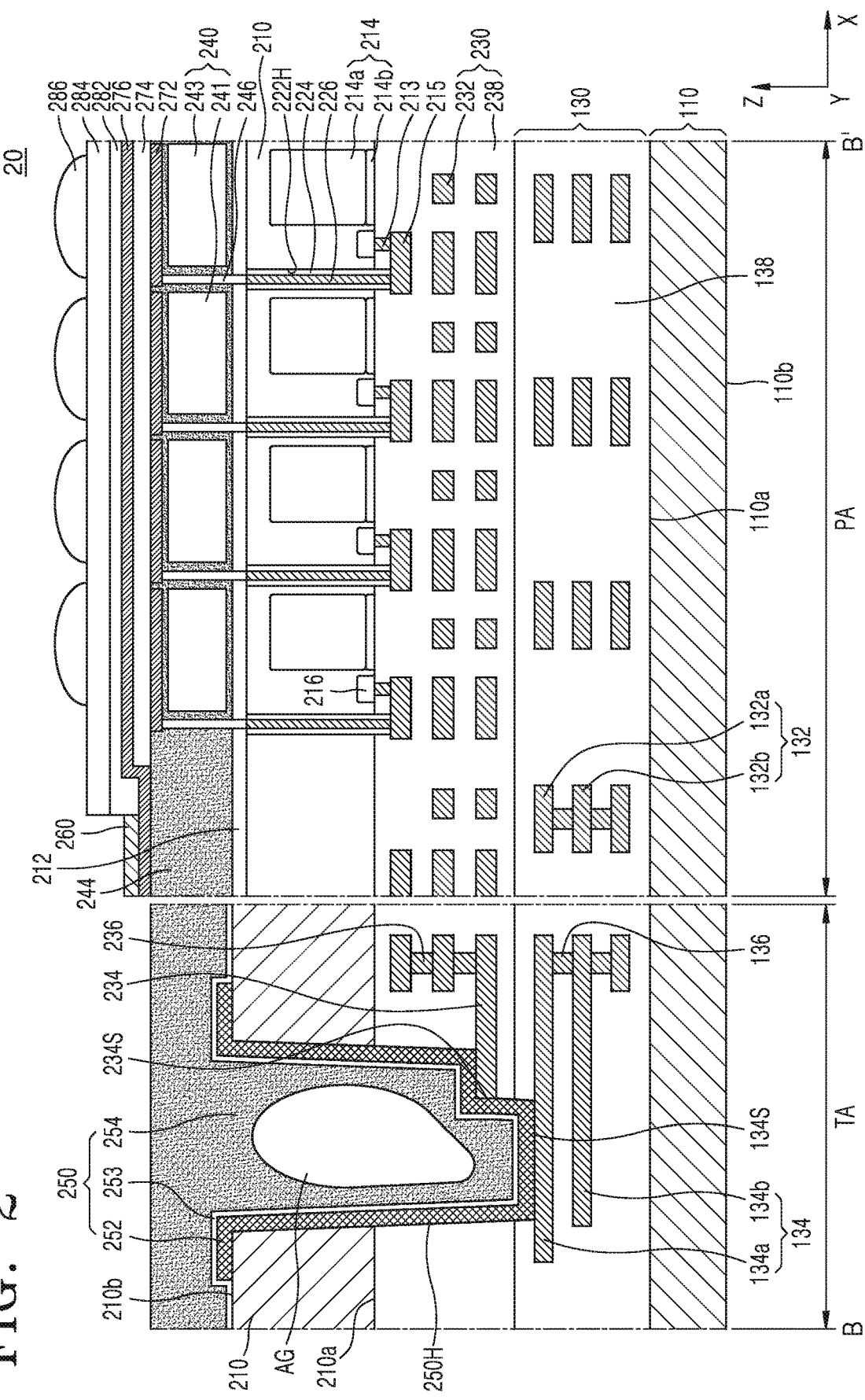
FIGS. 2 through 6 are cross-sectional views illustrating image sensors according to some example embodiments, respectively.

Referring to FIG. 2, the image sensor 20 according to some example embodiments may include, in the via electrode area TA, the electrode conductive layer 252 and an electrode liner 253 conformally formed along the second surface 210b of the second substrate 210.

For example, the via electrode structure 250 may include the electrode conductive layer 252 conformally formed along the via electrode hole 250H, the electrode liner 253 conformally formed along the electrode conductive layer 252 and the second surface 210b of the second substrate 210, and the electrode filling layer 254 which fills the via electrode hole 250H remaining after the electrode liner 253 is formed and includes the air gap AG.

The electrode liner 253 may include, for example, silicon oxide, silicon nitride, and/or silicon oxynitride. In some example embodiments, the electrode liner 253 may include substantially the same material as the electrode filling layer 254.

However, unlike the electrode filling layer 254, a process of forming the electrode liner 253 may use a process method having a relatively good step coverage. For example, the electrode liner 253 may be formed by an atomic layer deposition (ALD) process, a plasma-enhance chemical vapor deposition (PECVD) process, etc.

Figure 3:
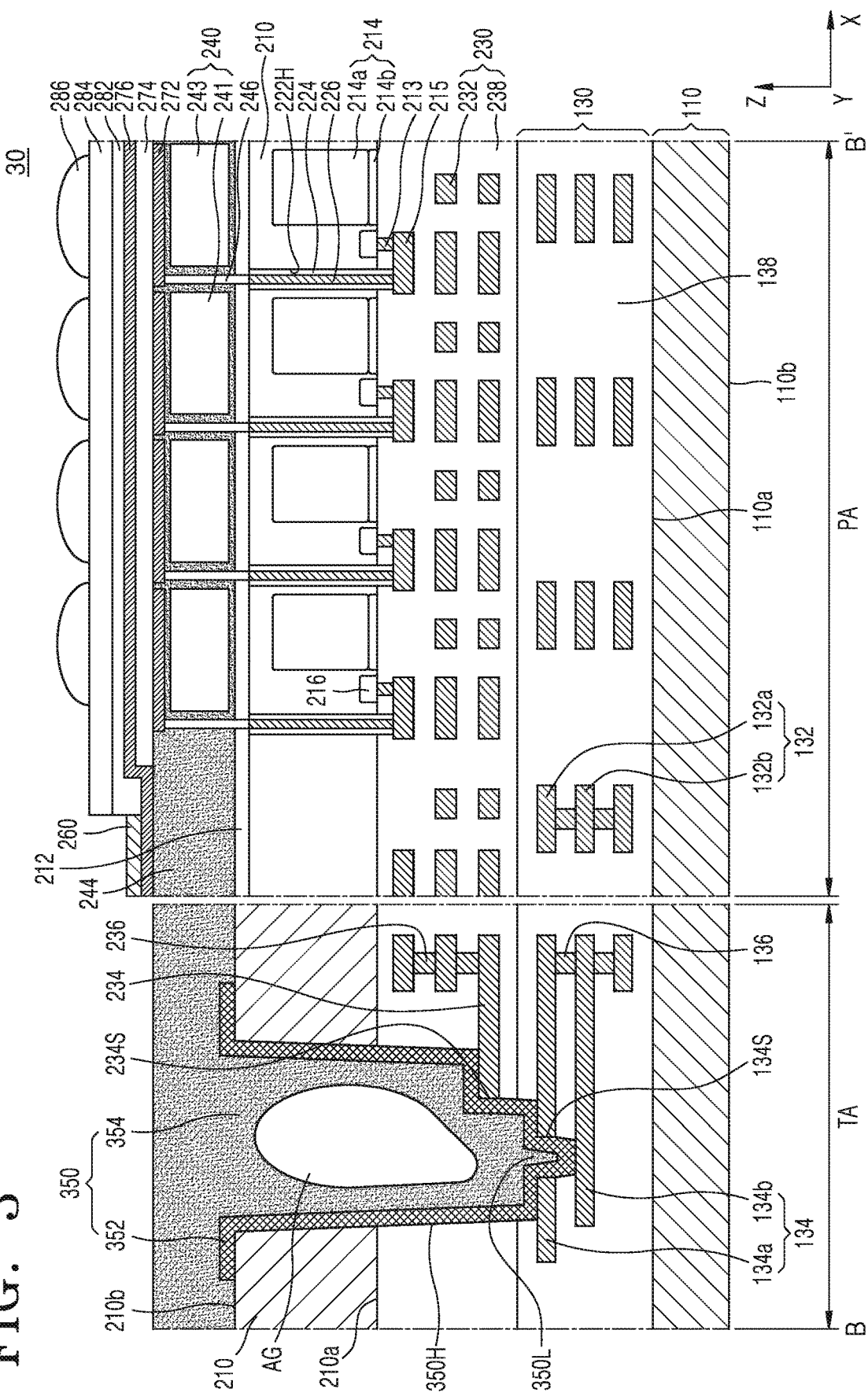

Referring to FIG. 3, in the image sensor 30, a bottom portion 350L of a via electrode structure 350 may be in contact with the plurality of first conductive layers 134 in the first structure 130.

For example, the via electrode structure 350 may be electrically connected by contacting each of the first conductive layers 134a and 134b formed at different levels in the first structure 130.

To this end, the first conductive layer 134a arranged at an uppermost level among the first conductive layers 134 may include at least one hole. The bottom portion 350L of the via electrode structure 350 may penetrate the hole in the first conductive layer 134a so as to contact the first conductive layer 134b positioned at a lower level than the first conductive layer 134a. In other words, the bottom portion 350L of the via electrode structure 350 may be formed in a concavo-convex shape having at least one protrusion, for example.

The via electrode structure 350 may be in contact with the surface 234S of the second conductive layer 234. In addition, the bottom portion 350L of the via electrode structure 350 may also contact the surface 134S of the first conductive layer 134a exposed by the hole.

When the via electrode structure 350 is in contact with each of the first conductive layers 134 formed at different levels from each other, a bonding area between the via electrode structure 350 and the first conductive layers 134 may be increased. Accordingly, a bonding resistance between the via electrode structure 350 and the first conductive layers 134 may be reduced.

Figure 4:
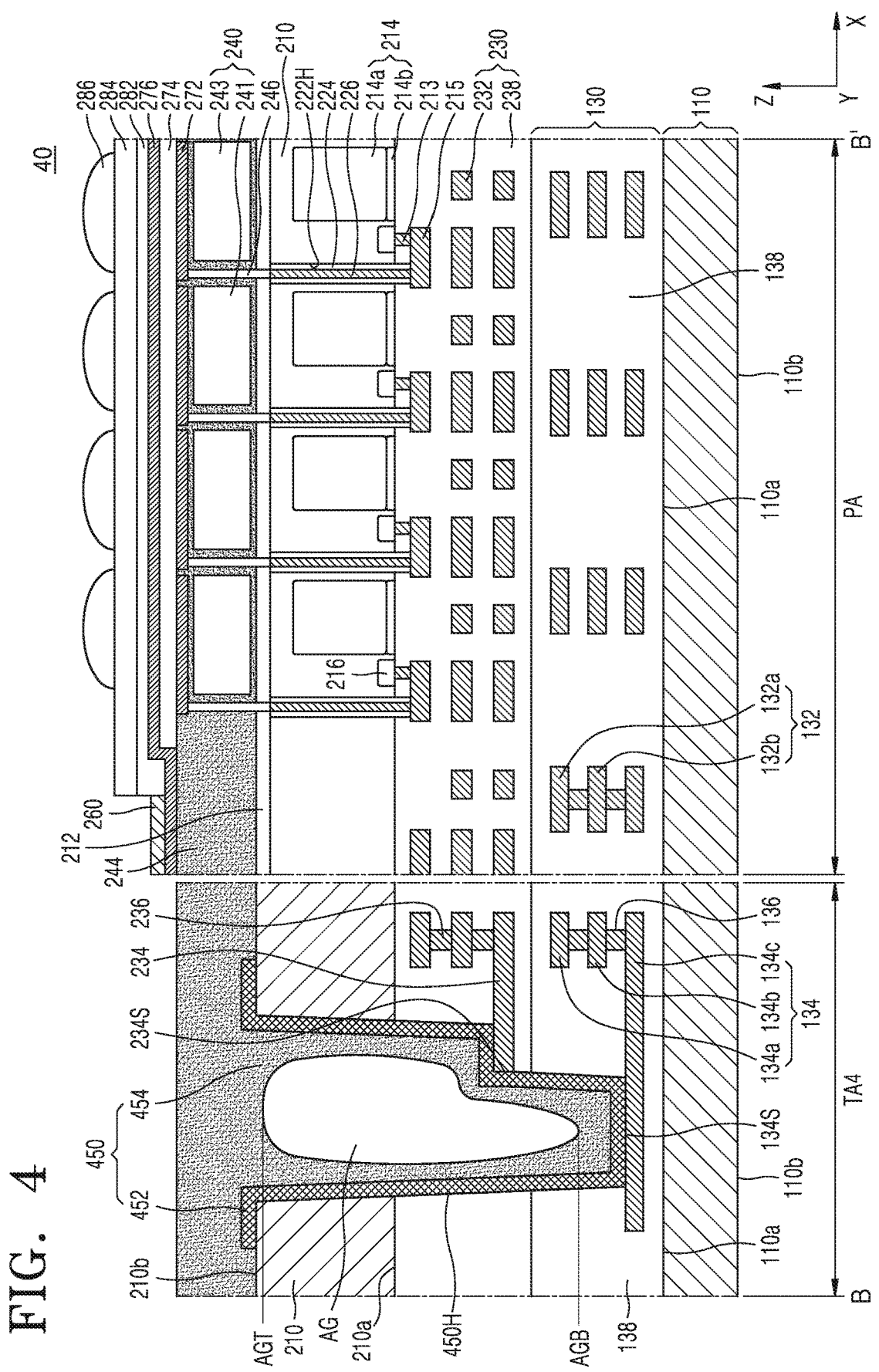

Referring to FIG. 4, in the image sensor 40 according to some example embodiments, a via electrode structure 450 may contact a first conductive layer 134c positioned at a lowermost level among the first conductive layers 134a, 134b, and 134c, which are formed at different levels in the first structure 130 on the first substrate 110.

In this case, as a depth of a via electrode hole 450H becomes relatively deep, the via electrode structure 450 may include the air gap AG having a relatively large size.

In some example embodiments, the air gap AG may be formed across the first structure 130 and the second substrate 210. For example, an uppermost surface AGT of the air gap AG may be arranged in the second substrate 210, and a lowermost surface AGB of the air gap AG may be arranged in the first structure 130 on the first substrate 110. However, a position of the air gap AG is not limited thereto.

Figure 5:
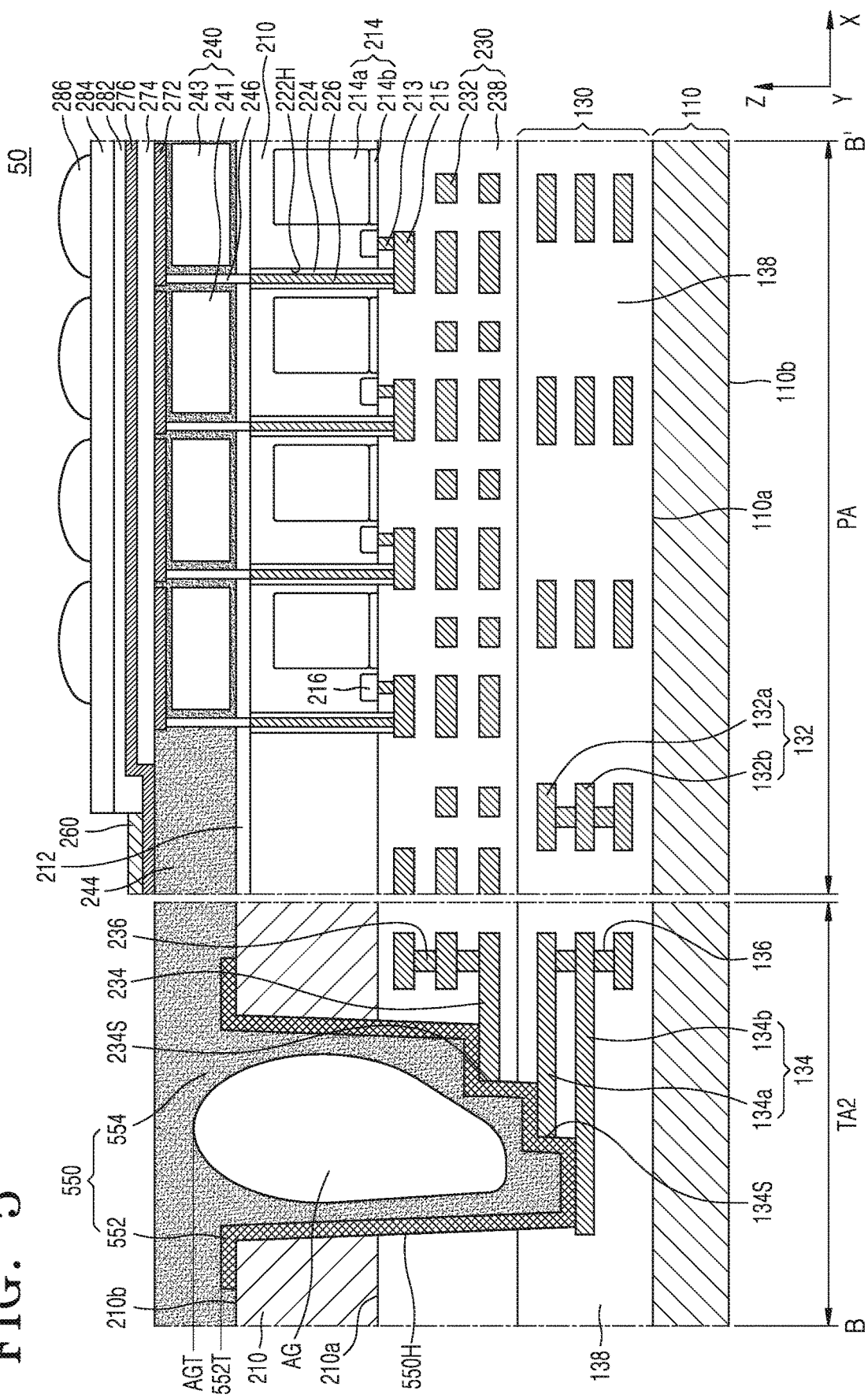

Referring to FIG. 5, in the image sensor 50 of some example embodiments, a via electrode structure 550 may be in contact with each of the plurality of first conductive layers 134 in the first structure 130 and one second conductive layer 234 in the second structure 230.

For example, the via electrode structure 550 may be electrically connected by contacting each of the first conductive layers 134a and 134b formed at different levels in the first structure 130.

To this end, the first conductive layer 134a located at the uppermost level among the first conductive layers 134 and the first conductive layer 134b located at a lower level than the first conductive layer 134a may be arranged in a stepped shape in an area in which the first conductive layers 134a and 134b are in contact with the via electrode structure 550.

For example, both a first side wall and a second side wall of the electrode conductive layer 552 may have a tapered shape, while the first side wall of the electrode conductive layer 552 may have a flat shape and the second side wall of the electrode conductive layer 552 may have a stepped shape. For example, the first side wall may be the left side wall and the second side wall may be the right side wall of the electrode conductive layer 552 in FIG. 5, although some other example embodiments are not limited thereto. Accordingly, the via electrode structure 550 may sequentially contact the second conductive layer 234, the first conductive layer 134a, and the first conductive layer 134b.

When the via electrode structure 550 is in contact with each of the first conductive layers 134 (e.g., the first conductive layers 134a and 134b) formed at different levels from each other, a bonding area between the via electrode structure 550 and the first conductive layers 134 may be increased. Accordingly, a bonding resistance between the via electrode structure 550 and the first conductive layers 134 may be reduced.

In some example embodiments, a level of the uppermost surface AGT of the air gap AG may be higher than a level of a top surface 552T of an electrode conductive layer 552. In other words, the air gap AG may be formed not only in the inner area of the via electrode hole 550H, but also in the outer area of the via electrode hole 550H. However, a position of the air gap AG is not limited thereto.

Figure 6:
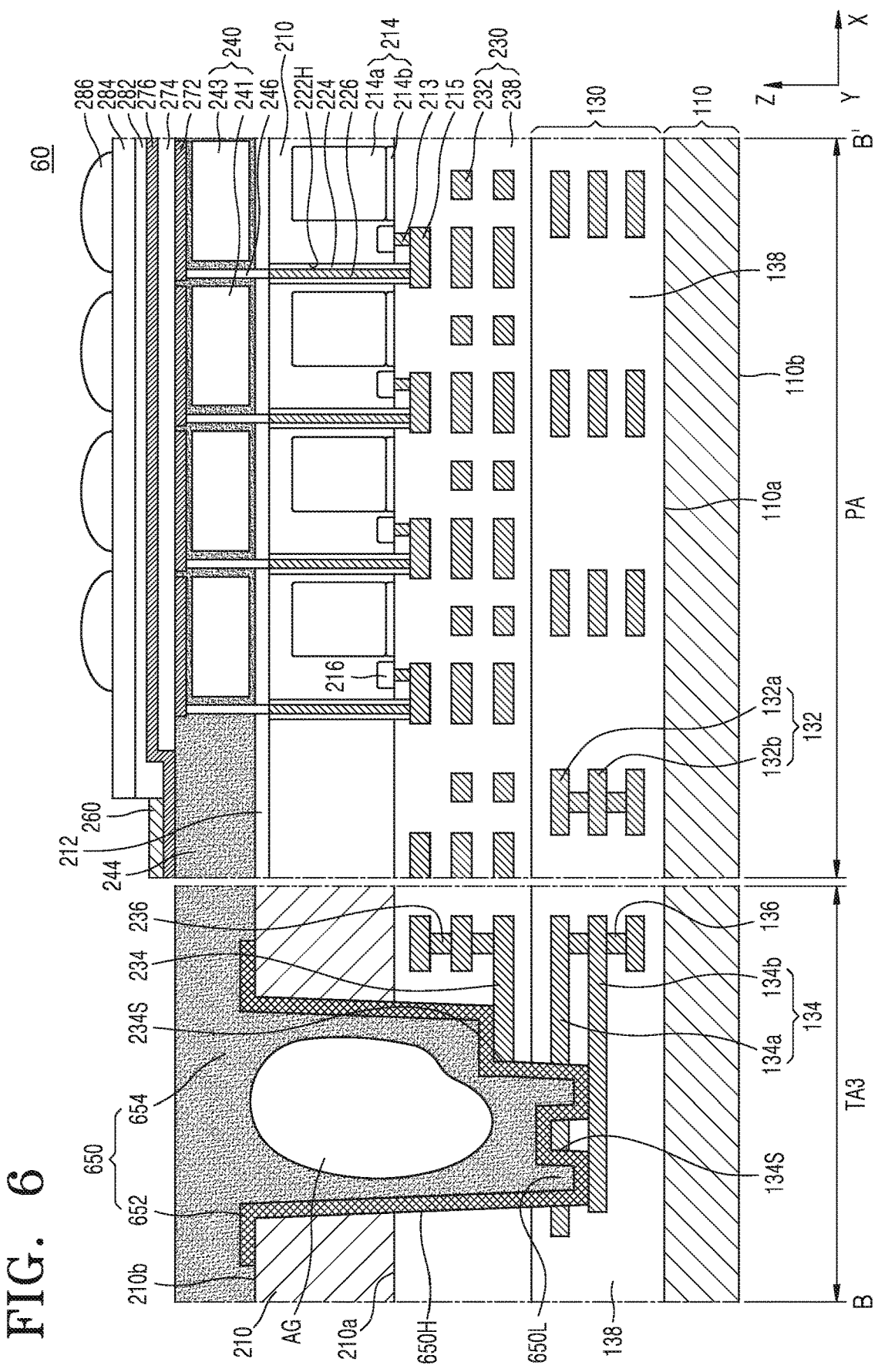

Referring to FIG. 6, in the image sensor 60, a bottom portion 650L of a via electrode structure 650 may be in contact with the plurality of first conductive layers 134 in the first structure 130.

For example, the via electrode structure 650 may be electrically connected by contacting each of the first conductive layers 134a and 134b formed at different levels in the first structure 130.

To this end, the first conductive layer 134a arranged at an uppermost level among the first conductive layers 134 may include a plurality of holes. The bottom portion 650L of the via electrode structure 650 may penetrate the plurality of holes so as to contact a plurality of portions of the first conductive layer 134b positioned at a lower level than the first conductive layer 134a.

The via electrode structure 650 may be in contact with the surface 234S of the second conductive layer 234. In addition, the bottom portion 650L of the via electrode structure 650 may also contact the surface 134S of the first conductive layer 134a exposed by the plurality of holes.

When the via electrode structure 650 is in contact with each of the first conductive layers 134 formed at different levels from each other, a bonding area between the via electrode structure 650 and the first conductive layers 134 may be increased. Accordingly, a bonding resistance between the via electrode structure 650 and the first conductive layers 134 may be reduced.

In addition, the via electrode structure 650 may be more three-dimensionally in contact with the first conductive layers 134 formed at different levels from each other, and thus it may be possible to reduce a contact failure problem which may otherwise occur between the via electrode structure 650 and the first conductive layers 134.

FIGS. 7A through 7E are cross-sectional views illustrating a method of manufacturing an image sensor according to a process sequence, according to some example embodiments.

Figure 7A:
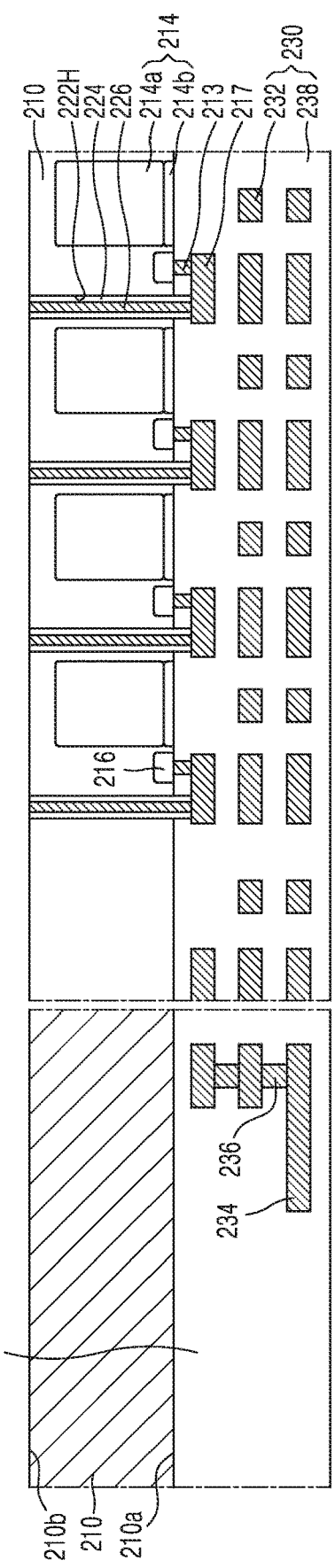
FIGS. 7A through 7E are cross-sectional views illustrating a method of manufacturing an image sensor according to a process sequence, according to some example embodiments.
Figure 7A:
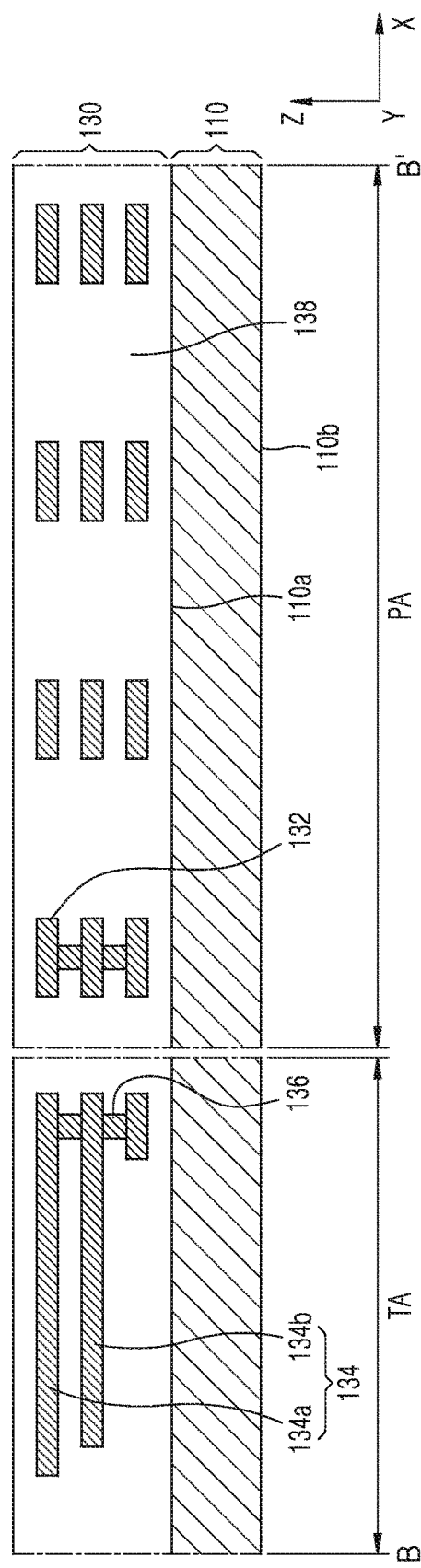

Referring to FIG. 7A, the first surface 110a of the first substrate 110 and the first surface 210a of the second substrate 210 may be arranged to face each other, and the first structure 130 and the second structure 230 may be bonded to each other.

For example, the bonding process of the first structure 130 and the second structure 230 may be performed by at least one of heating, pressurizing, and/or plasma processing.

In some example embodiments, the plurality of photoelectric conversion elements 214 may be arranged in the pixel area PA of the second substrate 210. The storage node area 216 may be arranged adjacent to (e.g., near, next to, neighboring) the photoelectric conversion element 214.

The pixel area PA of the first substrate 110 may correspond to the element area. The logic device (not shown) for controlling the image sensor 10 (refer to FIG. 1B) may be arranged in the element area of the first substrate 110.

Figure 7B:
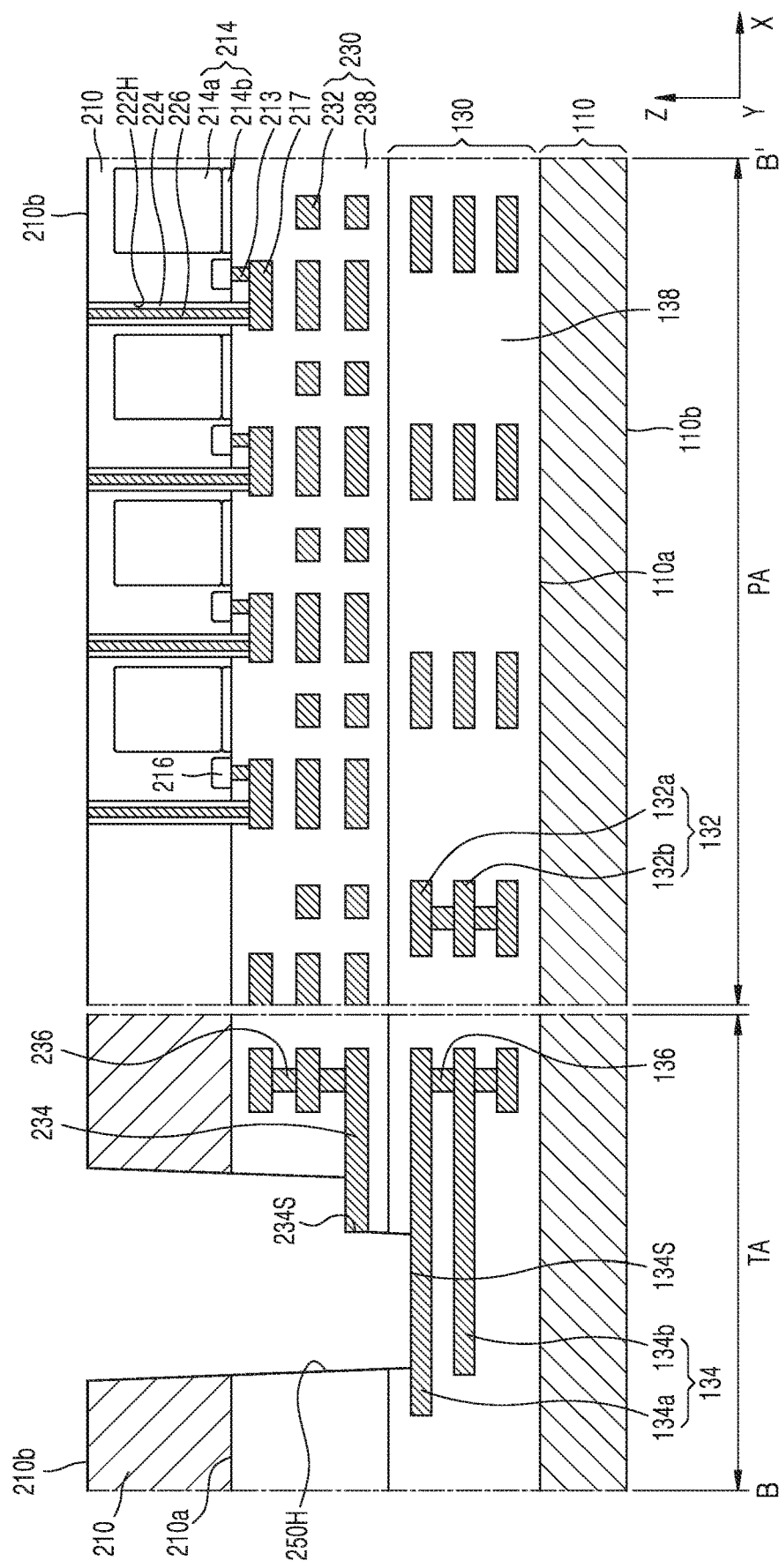

Referring to FIG. 7B, in the via electrode area TA, an etching process may be performed to penetrate the second substrate 210 and the second structure 230 so that the via electrode hole 250H exposing the surface 134S of the first conductive layers 134 and the surface 234S of the second conductive layer 234 is formed.

In some example embodiments, the etching process may be performed using an anisotropic etching process. Although not shown in FIG. 7B, during the etching process, a mask pattern that opens an area where the via electrode hole 250H is formed on the second surface 210b of the second substrate 210, and covers the other area, may be formed. By using the mask pattern as an etching mask, the via electrode hole 250H may be formed. In addition, during the etching process, the first conductive layers 134 and the second conductive layer 234 may serve as an etch stop layer.

In FIG. 7B, the first conductive layers 134 and the second conductive layer 234 are illustrated as not being etched by the etching process, but some other example embodiments are not limited thereto. In some other example embodiments, the first conductive layers 134 and the second conductive layer 234 may be at least partially etched by the etching process.

After the etching process is completed, the mask pattern may be removed. In addition, a cleaning process, etc. for removing residues that may occur in the etching process may be additionally performed.

Figure 7C:
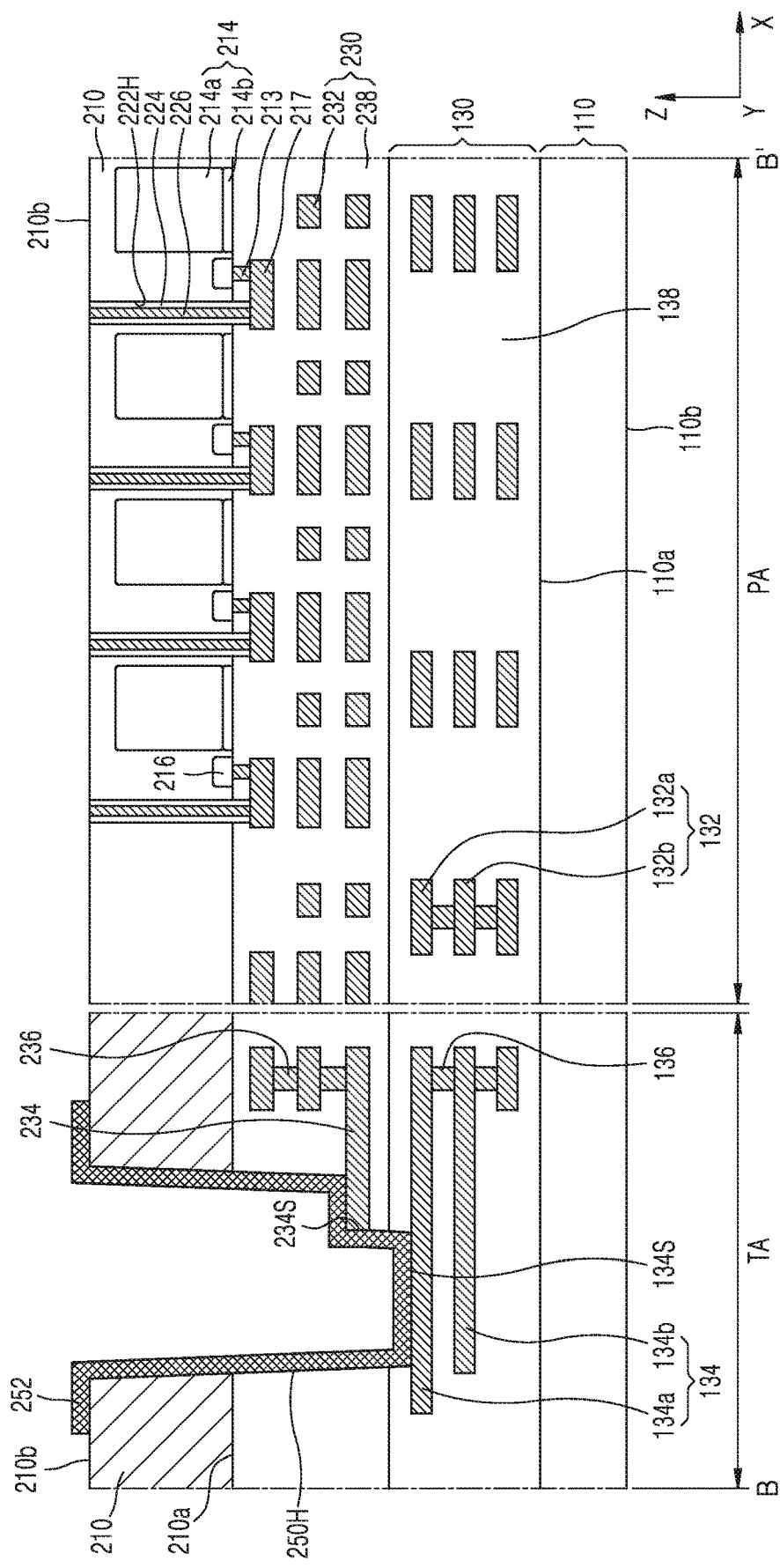

Referring to FIG. 7C, the electrode conductive layer 252 that conformally covers a partial area of the second surface 210b of the second substrate 210 and the via electrode hole 250H may be formed.

In some example embodiments, to form the electrode conductive layer 252, chemical vapor deposition (CVD), metal organic CVD (MOCVD), atomic layer deposition (ALD), and/or metal organic ALD (MOALD) may be used, but some other example embodiments are not limited thereto. The electrode conductive layer 252 may include, for example, tungsten (W) or a tungsten alloy.

After a conductive material covering the second surface 210b of the second substrate 210 is formed in the via electrode area TA and the pixel area PA, a process of removing a remaining portion of the conductive material may be performed so that only the electrode conductive layer 252 remains in the via electrode area TA. By using such a process, the electrode conductive layer 252 may be formed in the via electrode area TA.

Figure 7D:
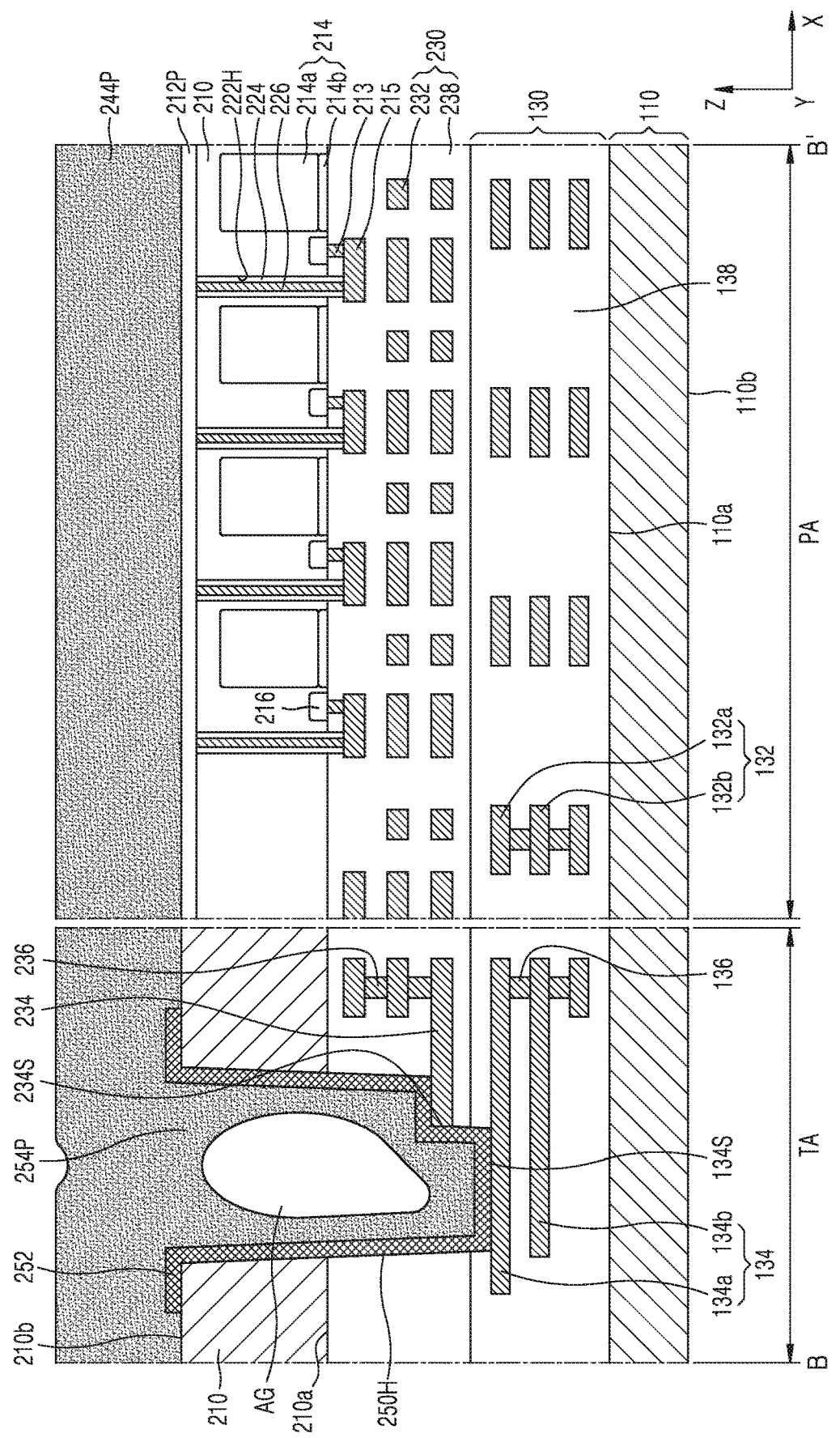

Referring to FIG. 7D, in the via electrode area TA and the pixel area PA, a preliminary electrode filling layer 254P which covers (e.g., covers entirely) the second surface 210b of the second substrate 210 and includes the air gap AG in a portion of the via electrode hole 250H may be formed.

In some example embodiments, in the pixel area PA, a portion of the second surface 210b of the second substrate 210 may be partially recessed, and a preliminary anti-reflective layer 212P covering (e.g., covering flatly) the portion of the second surface 210b may be formed.

The preliminary electrode filling layer 254P may be formed to have a sufficiently large thickness to include the air gap AG while filling a portion of the via electrode hole 250H.

The preliminary electrode filling layer 254P may include a material formed by a process having a relatively poor step coverage. The air gap AG may be referred to as a portion of a space inside the via electrode hole 250H that the preliminary electrode filling layer 254P does not fill. In other words, since the space inside the via electrode hole 250H has a relatively large aspect ratio, a process having a good step coverage may be used to fill all the space. However, to form the air gap AG, the image sensor according to example embodiments of the inventive concepts may intentionally use a material having a relatively poor step coverage in the process of forming the preliminary electrode filling layer 254P.

Figure 7E:
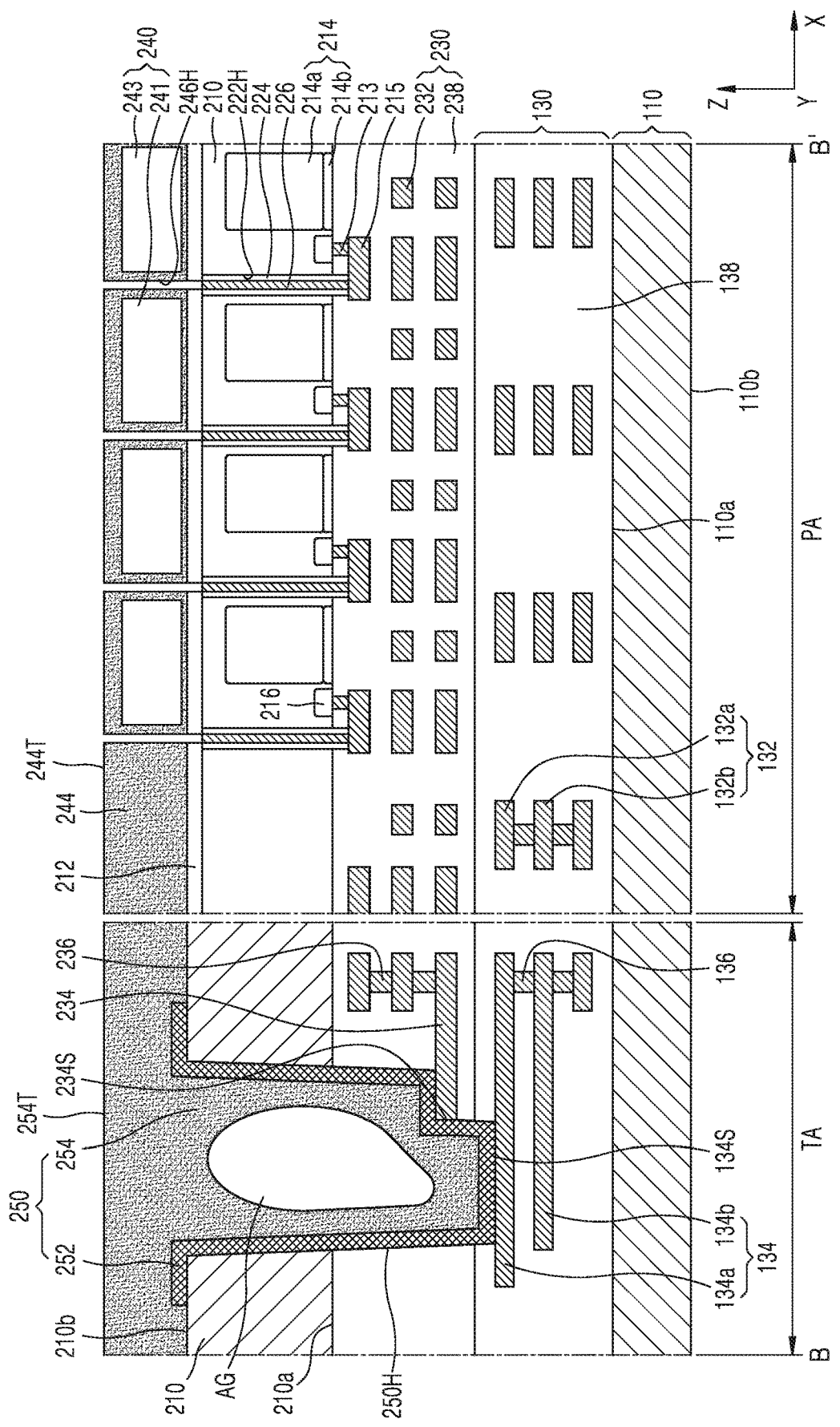

In a subsequent process, the preliminary electrode filling layer 254P in the via electrode area TA may be formed as the electrode filling layer 254 (refer to FIG. 7E), and the preliminary electrode filling layer 254P in the pixel area PA may be formed as the first cover insulating layer 244 (refer to FIG. 7E). In this manner, since the first cover insulating layer 244 (refer to FIG. 7E) and the electrode filling layer

254 (refer to FIG. 7E) may be formed at substantially the same time by substantially the same process, they may be formed of substantially the same material.

Referring to FIG. 7E, by planarizing the preliminary electrode filling layer 254P (refer to FIG. 7D) by a chemical mechanical polishing (CMP) process, etc., the electrode filling layer 254 in the via electrode area TA and the first cover insulating layer 244 in the pixel area PA may be formed.

Through the CMP process, a top surface 254T of the electrode filling layer 254 and a top surface 244T of the first cover insulating layer 244 may be formed at substantially the same level.

The color filter layer 240 may be formed in a portion of the first cover insulating layer 244. In some example embodiments, the color filter layer 240 may include the first color filter layer 241 and the second color filter layer 243. After the color filter layer 240 is formed in the first cover insulating layer 244, a material substantially identical (or similar) to the first cover insulating layer 244 may be formed on the color filter layer 240.

In some example embodiments, in the first cover insulating layer 244 and the anti-reflective layer 212, a second via plug hole 246H to be filled with the second via plug 246 (refer to FIGS. 1B through 6), which is electrically connected to the first via plug 226 through the first cover insulating layer 244, and the anti-reflective layer 212, may be formed. In some other example embodiments, in a process of forming the second via plug hole 246H, formation of the first via hole 222H may be performed at the same time.

Referring again to FIG. 1B, the image sensor 10 may be completed by forming, in the pixel area PA of the second substrate 210, the bottom transparent electrode layer 272, the organic photoelectric layer 274, and the top transparent electrode layer 276, and the microlens 286.

The image sensor 10 according to some example embodiments of the inventive concepts may include the via electrode structure 250 including the air gap AG therein, and accordingly, a material having a relatively good step coverage (e.g., a negative photoresist susceptible to high temperatures) may not be required to fill the inner area of the via electrode structure 250, in contrast to the conventional image sensor. Thus, the contamination that may otherwise be caused due to the material filling the inner area of the via electrode structure 250 may be effectively prevented (limited or reduced), and accordingly, the productivity and reliability of the image sensor 10 including the organic photoelectric layer 274 may be improved as compared to the above-described conventional image sensor.

Figure 8:
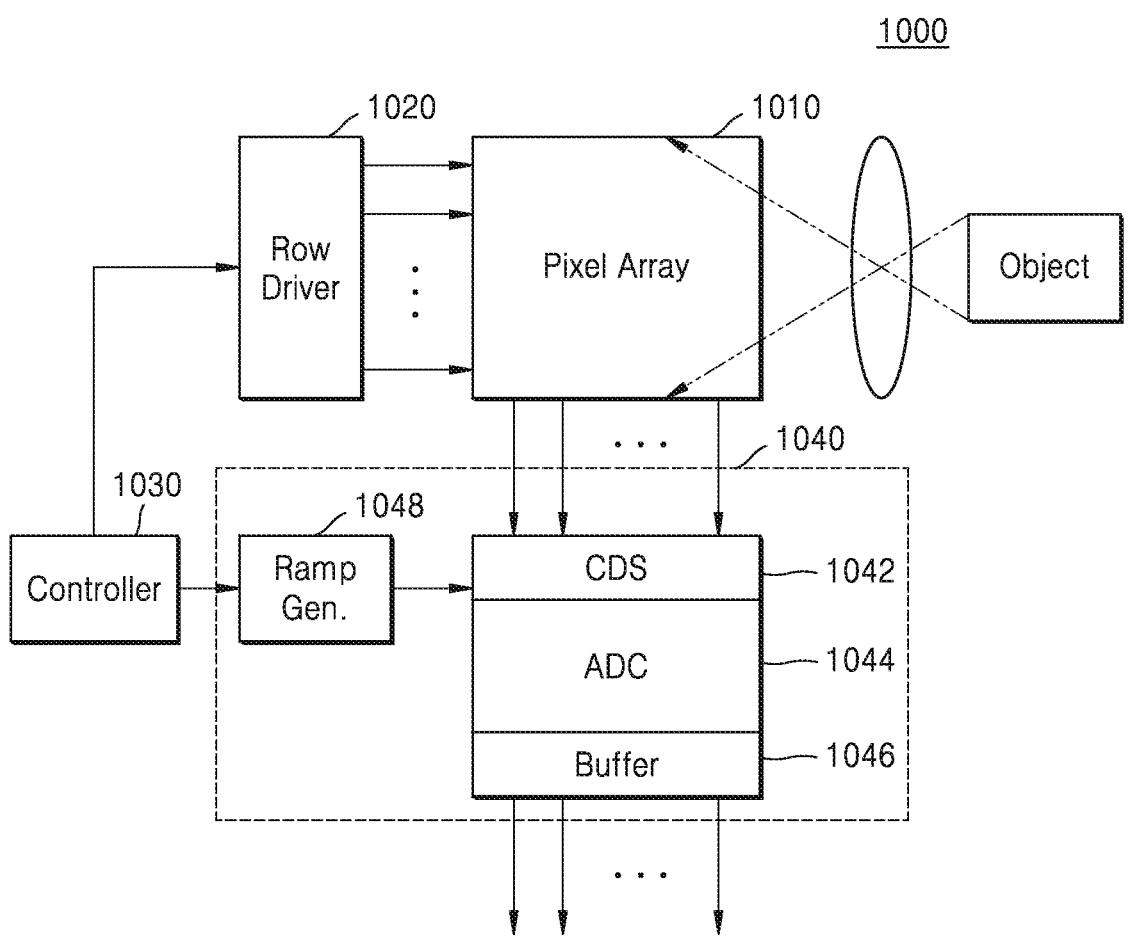
FIG. 8 is a block diagram illustrating a configuration of an image sensor according to some example embodiments.

FIG. 8 is a block diagram illustrating a configuration of an image sensor 1000 according to some example embodiments.

Referring to FIG. 8, the image sensor 1000 may include a pixel array 1010, a row driver 1020, a controller 1030, and a pixel signal processor 1040.

The image sensor 1000 may include at least one of the image sensors 10, 20, 30, 40, 50, 60 described in FIGS. 1A through 6.

The pixel array 1010 may include a plurality of unit pixels arranged two-dimensionally, and each unit pixel may include a photoelectric conversion element. The photoelectric conversion element may absorb light to generate charge, and an electrical signal (or an output voltage) according to the generated charge may be provided to the pixel signal processor 1040 through a vertical signal line. The unit pixels included in the pixel array 1010 may provide the output voltage one at a time in row units, and accordingly, the unit pixels belonging to one row of the pixel array 1010 may be simultaneously activated by a selection signal output by the row driver 1020. The unit pixel belonging to the row may provide the output voltage corresponding to the absorbed light to an output line of a corresponding column.

The controller 1030 may control the pixel array 1010 so that the pixel array 1010 absorbs light to accumulate the charge, or store temporarily the accumulated charge, and output an electrical signal corresponding to the stored charge to the outside of the pixel array 1010. In addition, the controller 1030 may control the pixel signal processor 1040 to measure the output voltage provided by the pixel array 1010.

The pixel signal processor 1040 may include a correlated double sampler (CDS) 1042, an analog-to-digital converter (ADC) 1044, and a buffer 1046. The CDS 1042 may sample and hold the output voltage provided by the pixel array 1010. The CDS 1042 may double-sample a certain noise level and a level of the generated output voltage, and output a level corresponding to a difference therebetween. In addition, the CDS 1042 may receive ramp signals generated by a ramp signal generator 1048, compare the ramp signals with each other, and output a result of the comparison.

The ADC 1044 may convert an analog signal corresponding to the level received from the CDS 1042 into a digital signal. The buffer 1046 may latch the digital signal, and the latched signal may be sequentially output to the outside of the image sensor 1000 and transferred to an image processor (not shown).

Figure 9:
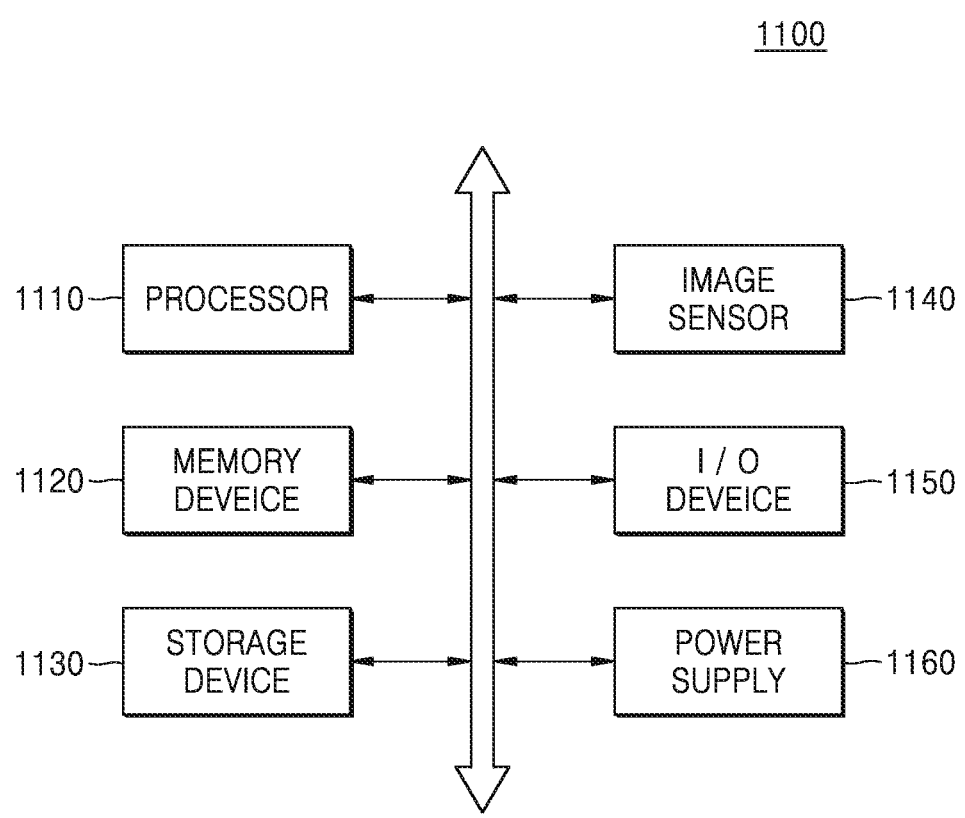
FIG. 9 is a block diagram illustrating an electronic system including an image sensor, according to some example embodiments.

FIG. 9 is a block diagram illustrating an electronic system 1100 including an image sensor 1140, according to some example embodiments.

Referring to FIG. 9, the electronic system 1100 may include a processor 1110, a memory device 1120, a storage device 1130, the image sensor 1140, an input/output (I/O) device 1150, and a power supply 1160. Although not shown in FIG. 9, the electronic system 1100 may further include ports for communicating with, video cards, sound cards, memory cards, USB devices, etc., and/or other electronic systems, for example.

The processor 1110 may perform certain calculations or tasks. For example, the processor 1110 may be a microprocessor or a central processing unit (CPU). The processor 1110 may be connected to the memory device 1120, the storage device 1130, and the I/O device 1150 to perform communication via an address bus, a control bus, a data bus, etc. In some embodiments, the processor 1110 may also be connected to an expansion bus, such as a peripheral component interconnect (PCI) bus.

The memory device 1120 may store data required for an operation of the electronic system 1100. The storage device 1130 may include a solid state drive (SSD), a hard disk drive (HDD), and/or a compact disk read-only memory (CD-ROM).

The I/O device 1150 may include input tools such as a keyboard, a keypad, and a mouse, and output tools such as a printer, and a display. The power supply 1160 may supply an operating voltage required for the operation of the electronic system 1100.

The image sensor 1140 may be connected to the processor via the buses described above and/or other communication links to perform communication. The image sensor 1140 may include at least one of the image sensors 10, 20, 30, 40, 50, 60 described in FIGS. 1A through 6.

Figure 10:
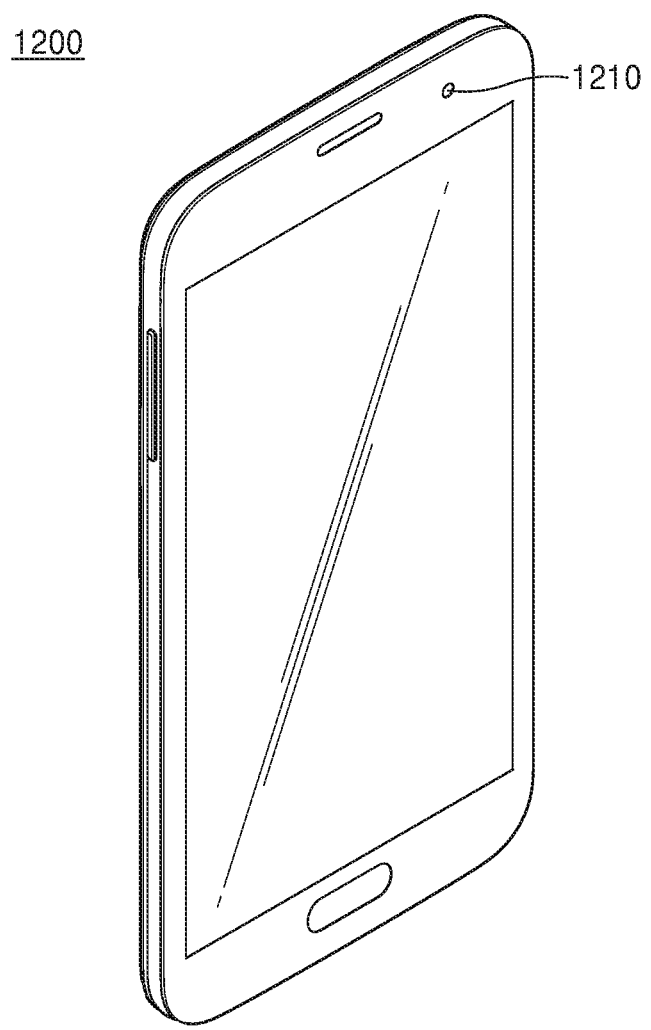
FIG. 10 is a block diagram illustrating an electronic device to which an image sensor is applied, according to some example embodiments.

FIG. 10 is a block diagram illustrating an electronic device 1200 to which an image sensor 1210 is applied, according to some example embodiments.

Referring to FIG. 10, an electronic device 1200 (e.g., a mobile phone, etc.) to which the image sensor 1210 is applied is illustrated. The image sensor 1210 may include at least one of the image sensors 10, 20, 30, 40, 50, 60 described in FIGS. 1A through 6.

In some example embodiments, a plurality of image sensors 1210 may be included in the electronic device 1200. For example, one image sensor 1210 may be included in a front side of the electronic device 1200 and another image sensor 1210 may be included in a back side of the electronic device 1200.

The image sensor 1210 may be applied to a smart phone, a personal digital assistant (PDA), a portable multimedia player (PMP), a portable game machine, a portable computer, a web tablet, a display device, and/or any electronic device capable of processing images.

Problems to be solved by example embodiments of the inventive concepts are not limited to the above-mentioned problems, and other matters not mentioned may be clearly understood by those skilled in the art from the description herein.

Although some example embodiments of the inventive concepts have been described with reference to attached drawings, it should be appreciated by those of ordinary skill in the art that the inventive concepts may be implemented in other particular applications without changing the technical aspects or characteristics thereof. Therefore, the example embodiments described above should be understood as exemplary in all aspects and non-limiting.

What is claimed is:

1. An image sensor comprising:
a first substrate;
a first structure on a front surface of the first substrate, wherein the first structure comprising a first interlayer insulating layer including a first conductive layer;
a second substrate;
a second structure on a front surface of the second substrate facing the front surface of the first substrate, the second structure comprising a second interlayer insulating layer, the second interlayer insulating layer being bonded to the first interlayer insulating layer;
an organic photoelectric layer on a back surface of the second substrate; and
a via electrode structure in contact with the first conductive layer through the second substrate and the second structure, wherein the via electrode structure comprising an air gap therein.

2. The image sensor of claim 1, wherein the via electrode structure comprises:
an electrode conductive layer on an inner wall of a via electrode hole penetrating the second substrate and the second structure; and
an electrode filling layer on the electrode conductive layer, the electrode filling layer filling a portion of the via electrode hole, and comprising the air gap.

3. The image sensor of claim 2, further comprising:
a color filter layer under the organic photoelectric layer; and
a first cover insulating layer on the color filter layer,
wherein the electrode filling layer and the first cover insulating layer include an identical material on an identical level.

4. The image sensor of claim 3, wherein a level of a top surface of the electrode filling layer is identical to, or lower than, a level of a bottom surface of the organic photoelectric layer.

5. The image sensor of claim 2, further comprising an electrode liner between the electrode conductive layer and the electrode filling layer.

6. The image sensor of claim 2, wherein a level of an uppermost surface of the air gap is higher than a level of an uppermost surface of the electrode conductive layer.

7. The image sensor of claim 1, wherein the air gap extends from the second substrate to the second interlayer insulating layer.

8. The image sensor of claim 1, wherein the air gap extends from the second substrate to the first interlayer insulating layer.

9. The image sensor of claim 1, wherein the second structure on the second substrate further comprises a second conductive layer, wherein the via electrode structure is in contact with the second conductive layer.

10. The image sensor of claim 9, wherein the first conductive layer comprises at least two stacked conductive layers, and the via electrode structure is in contact with the at least two stacked conductive layers.

11. An image sensor comprising:
a first substrate comprising a first interlayer insulating layer;
a second substrate comprising a second interlayer insulating layer;
a color filter layer on the second substrate;
an organic photoelectric layer on the color filter layer;
a via electrode hole penetrating the second substrate and the second interlayer insulating layer, wherein the via electrode hole being in contact with the first interlayer insulating layer; and
a via electrode structure in the via electrode hole, wherein the via electrode structure comprises:
an electrode conductive layer comprising a conductive material; and
an electrode filling layer on the electrode conductive layer, wherein the electrode filling layer comprising an air gap at a central portion thereof and an insulating material.

12. The image sensor of claim 11, wherein the electrode conductive layer comprises tungsten (W) or a tungsten alloy, and the insulating material comprises at least one of tetraethyl orthosilicate (TEOS) or plasma enhanced-TEOS (PE-TEOS).

13. The image sensor of claim 11, wherein the air gap is encapsulated by the electrode filling layer.

14. The image sensor of claim 11, further comprising a first cover insulating layer on the color filter layer, wherein the first cover insulating layer comprises an identical material at an identical level as the electrode filling layer.

15. The image sensor of claim 13, the air gap extends from the second substrate to the second interlayer insulating layer.

16. An image sensor comprising:
a first substrate comprising a first via electrode region and an element region including a logic device;
a first interlayer insulating layer on a front surface of the first substrate, wherein the first interlayer insulating layer comprising a first conductive layer in the first via electrode region;
a second substrate comprising a second via electrode region and a pixel region including a photoelectric conversion element;

a second interlayer insulating layer on a front surface of the second substrate facing the front surface of the first substrate, wherein the second interlayer insulating layer being bonded to the first interlayer insulating layer;

a bottom transparent electrode layer on a back surface of the second substrate, the bottom transparent electrode layer corresponding to the photoelectric conversion element;

a top transparent electrode layer on the back surface of the second substrate;

an organic photoelectric layer between the top transparent electrode layer and the bottom transparent electrode layer; and a via electrode structure penetrating the second substrate and the second interlayer insulating layer in the second via electrode region to contact the first conductive layer in the first via electrode region, wherein the via electrode structure comprising an air gap therein.

17. The image sensor of claim 16, wherein the via electrode structure comprises:

an electrode conductive layer penetrating the second substrate and the second interlayer insulating layer in the second via electrode region, the electrode conductive layer on an inner wall of a via electrode hole extending to the first via electrode region; and an electrode filling layer on the electrode conductive layer, the electrode filling layer filling a portion of the via electrode hole, and comprising the air gap.

18. The image sensor of claim 17, wherein a top surface of the electrode filling layer is a flat surface, and a level of the top surface of the electrode filling layer is higher than a level of a top surface of the electrode conductive layer.

19. The image sensor of claim 17, wherein a bottom surface of the electrode conductive layer has a concavo-convex shape comprising at least one protruding portion.

20. The image sensor of claim 17, wherein the electrode conductive layer comprises a first side wall and a second side wall, both the first side wall and the second side wall of the electrode conductive layer have a tapered shape, wherein the first side wall has a flat shape, and the second side wall has a step shape.

* * * * *